United States Patent
Tanaka (10) Patent No.: US 8,581,471 B2
(45) Date of Patent: Nov. 12, 2013

(54) PIEZOELECTRIC FAN AND COOLING DEVICE

(75) Inventor: Nobuhira Tanaka, Nagaokakyo (JP)

(73) Assignee: Murata Manufacturing Co., Ltd., Kyoto (JP)

(*) Notice: Subject to any disclaimer, the term of this patent is extended or adjusted under 35 U.S.C. 154(b) by 504 days.

(21) Appl. No.: 12/950,037

(22) Filed: Nov. 19, 2010

(65) Prior Publication Data

US 2011/0120679 A1   May 26, 2011

(30) Foreign Application Priority Data

Nov. 20, 2009   (JP) ................................. 2009-264756

(51) Int. Cl.
*H01L 41/08* (2006.01)

(52) U.S. Cl.
USPC ............ 310/328; 362/294; 165/80.3; 165/96; 165/121

(58) Field of Classification Search
USPC ............. 310/328; 362/294; 165/80.3, 96, 121
See application file for complete search history.

(56) References Cited

U.S. PATENT DOCUMENTS

| | | | |
|---|---|---|---|
| 5,861,703 A | 1/1999 | Losinski | |
| 7,204,615 B2 * | 4/2007 | Arik et al. | 362/294 |
| 7,321,184 B2 | 1/2008 | Lee et al. | |
| 7,550,901 B2 * | 6/2009 | Chrysler et al. | 310/330 |
| 7,642,698 B2 | 1/2010 | Leija et al. | |
| 2005/0231914 A1 | 10/2005 | Mikubo et al. | |
| 2007/0037506 A1 | 2/2007 | Lee et al. | |
| 2009/0085438 A1 | 4/2009 | Chrysler et al. | |

FOREIGN PATENT DOCUMENTS

| | | | | |
|---|---|---|---|---|
| CN | 101398015 A | | 4/2009 | |
| JP | 62-87700 A | | 4/1987 | |
| JP | 2-33500 A | | 2/1990 | |
| JP | 2000-513070 A | | 10/2000 | |
| JP | 2002-339900 A | | 11/2002 | |
| JP | 2002339900 A | * | 11/2002 | .............. F04D 33/00 |
| JP | 2006-191123 A | | 7/2006 | |
| JP | 2010-067909 A | | 3/2010 | |
| JP | 2010067910 A | * | 3/2010 | |
| WO | WO 2009116455 A1 | * | 9/2009 | ............ H01L 23/467 |

* cited by examiner

*Primary Examiner* — Jaydi San Martin
(74) *Attorney, Agent, or Firm* — Keating & Bennett, LLP (57) ABSTRACT

A piezoelectric element is attached to a vibrating plate. By expanding and contracting the piezoelectric element, the vibrating plate is bent. The vibrating plate includes removed regions on both sides of a portion to which the piezoelectric element is attached. The vibrating plate includes a plurality of the blades provided at one end thereof. By bending the vibrating plate, the blades swing. The blades are bent toward grooves between heat dissipating fins of a heat sink. The other end of the vibrating plate is fixed with screws to an upper portion of the heat sink with a supporting plate disposed therebetween such that the each of the blades are located in a groove between the heat dissipating fins of the heat sink and the removed regions are located over the grooves between the heat dissipating fins.

6 Claims, 12 Drawing Sheets

PIEZOELECTRIC FAN AND COOLING DEVICE

BACKGROUND OF THE INVENTION

1. Field of the Invention

The present invention relates to a piezoelectric fan that discharges warm air between heat dissipating fins of a heat sink, and a cooling device that includes such a piezoelectric fan.

2. Description of the Related Art

For recent electronic devices, countermeasures against heat inside the devices are becoming more important as the size of the device main body is further reduced and the high-density mounting of components progresses. For example, in personal computers, in addition to the size of device main body being reduced, the speed of CPUs is increasing in order to improve information processing performance. Therefore, while the high-density mounting of components leads to reduced ventilation inside the electronic devices, the amount of heat generated by the CPUs is increased. In such an environment, it is important to discharge warm air between heat dissipating fins of a heat sink disposed on the upper surface of a CPU and to thereby prevent an increase in the temperature of the CPU.

A piezoelectric fan that discharges warm air between heat dissipating fins of a heat sink is disclosed, for example, in KANEKO, "Shindo-shite kaze wo okuru hito-shinku wo jitsuen-tenji," (online), Sep. 25, 2009, Nikkei WinPC, (searched Oct. 16, 2009), Internet (URL: http://pc.nikkeibp.co.jp/article/news/20090925/1018872/?f=news) (hereinafter referred to as KANEKO). The structure of the piezoelectric fan shown in KANEKO and a cooling device including the piezoelectric fan will be described with reference to FIGS. 1 to 3.

Figure 1:
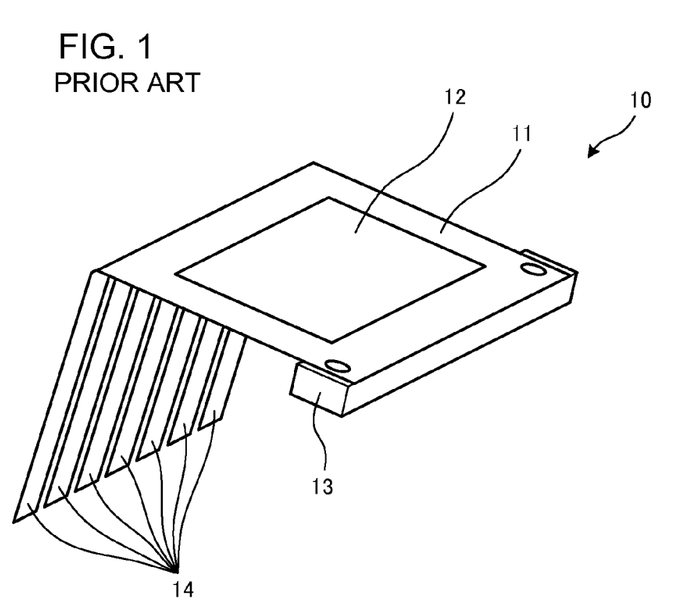
FIG. 1 is a perspective view showing the configuration of a conventional piezoelectric fan.
Figure 2:
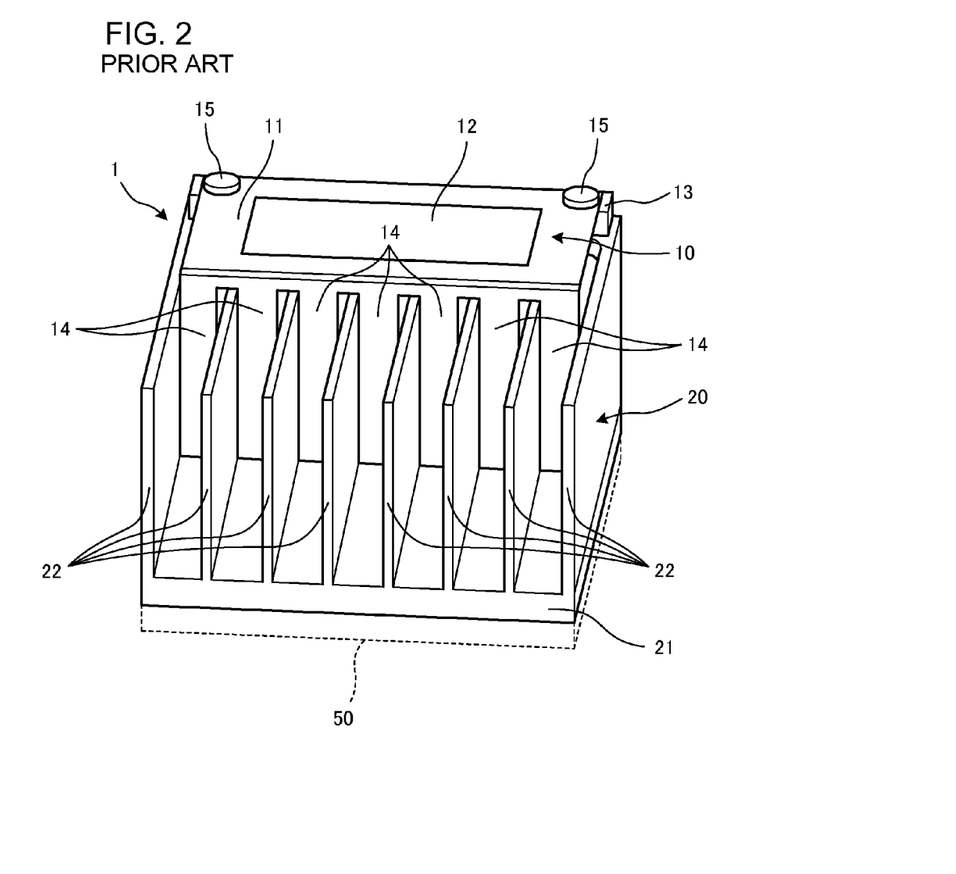
FIG. 2 is a perspective view showing the configuration of a cooling device having the conventional piezoelectric fan.
Figure 3:
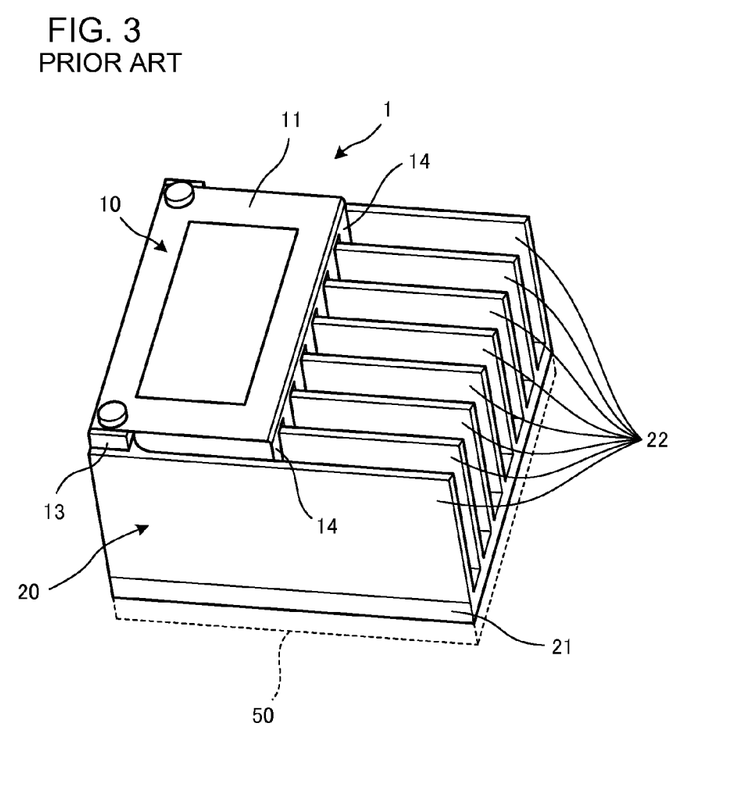
FIG. 3 is a perspective view showing the configuration of the cooling device having the conventional piezoelectric fan.

FIG. 1 is a perspective view showing the configuration of the piezoelectric fan of KANEKO. FIGS. 2 and 3 are perspective views showing the configuration of a cooling device including the piezoelectric fan of KANEKO. A piezoelectric fan 10 includes a vibrating plate 11, piezoelectric elements 12, and a supporting plate 13. A heat sink 20 includes a plurality of heat dissipating fins 22 extending from a base portion 21 upward and substantially parallel to each other. In FIGS. 2 and 3, a heat generating body 50, such as a CPU, is mounted on a circuit board, and the bottom surface of the heat sink 20 is disposed on the upper surface of the heat generating body 50 so as to be thermally coupled thereto. A cooling device 1 is configured by fixing the piezoelectric fan 10 to the heat sink 20, which is made of aluminum.

The piezoelectric elements 12 are each made by forming electrodes on both surfaces of a piezoelectric ceramics and polarizing the piezoelectric ceramics. The piezoelectric elements 12 are each a vibrating body that expands and contracts in response to the application of a voltage.

The piezoelectric elements 12 are attached to both surfaces of the vibrating plate 11. By expanding and contracting the piezoelectric elements 12, the vibrating plate 11 is bent. A plurality of blades 14 are provided in front of a portion of the vibrating plate 11 to which the piezoelectric elements 12 are attached. The blades 14 swing in response to bending of the vibrating plate 11.

A back end portion of the vibrating plate 11 located behind the portion to which the piezoelectric elements 12 are attached is fixed with screws 15 to the upper portion of the heat sink 20 with the supporting plate 13 disposed therebetween such that the plurality of blades 14 are located in the grooves between the heat dissipating fins 22 of the heat sink 20.

With this configuration, heat generated in the heat generating body 50 is conducted to the heat sink 20, air is warmed by the heat dissipating fins 22, and warm air is generated between the heat dissipating fins 22. The piezoelectric fan 10 discharges the warm air between the heat dissipating fins 22 by swinging the plurality of blades 14.

However, in the piezoelectric fan 10 of KANEKO, the heat dissipating fins 22 are covered by the vibrating plate 11, and therefore, the ventilation of the grooves between the heat dissipating fins 22 is reduced. In addition, in the piezoelectric fan 10 of KANEKO, the amount of bending displacement of the vibrating plate 11 to the applied voltage is relatively small, and vibration transmitted to the blades 14 is relatively weak. Therefore, the amplitude of the blades 14 is relatively small, and the airflow generating capability is relatively low.

When the piezoelectric fan 10 of KANEKO is installed on the heat sink 20, it does not have much of an effect on the heat dissipation from the heat dissipating fins 22. In recent years, many fast CPUs that generate a large amount of heat have been produced. Unfortunately, the piezoelectric fan 10 of KANEKO cannot sufficiently cool such CPUs.

SUMMARY OF THE INVENTION

To overcome the problems described above, preferred embodiments of the present invention provide a piezoelectric fan that achieves an improved cooling capability by improving the airflow generating capability of the blades and improving the ventilation of the grooves between the heat dissipating fins, and a cooling device including such a piezoelectric fan.

According to a preferred embodiment of the present invention, a piezoelectric fan includes at least one piezoelectric element that expands and contracts in response to application of a voltage, and a vibrating plate to which the at least one piezoelectric element is attached. The vibrating plate is bent by expanding and contracting the at least one piezoelectric element. The vibrating plate includes a plurality of blades provided at one end thereof. The plurality of blades swing as a result of bending of the vibrating plate. The vibrating plate preferably includes removed regions on both sides of a portion to which the at least one piezoelectric element is attached.

In this configuration, the vibrating plate preferably includes openings or cutouts defining the removed regions that are provided on both sides of a portion to which the at least one piezoelectric element is attached.

With this configuration, heat that is generated in the heat generating body is conducted to a heat sink, air is warmed by heat dissipating fins, and warm air is generated between the heat dissipating fins. The piezoelectric fan discharges the warm air between the heat dissipating fins by swinging the plurality of blades.

Due to the openings or the cutouts, the volume and mass of portions of the vibrating plate on both sides of the at least one piezoelectric element is decreased, and the amount of bending displacement of the vibrating plate to the applied voltage is increased accordingly. Therefore, in the piezoelectric fan according to a preferred embodiment of the present invention, the average amplitude of the tips of all the blades increases. In particular, the amplitude of the tips of the blades at both ends increases significantly. Therefore, the airflow generating capability of the blades is significantly improved.

When the piezoelectric fan is driven and the blades are swung, a downward flow of cool air through the openings or cutouts into the grooves between the heat dissipating fins or an upward flow of air warmed by the heat dissipating fins through the openings or cutouts, is generated. With the piezoelectric fan having this configuration, the ventilation of the grooves between the heat dissipating fins is significantly improved.

Therefore, the cooling capability is improved by improving the airflow generating capability of the blades and improving the ventilation of the grooves between the heat dissipating fins.

The piezoelectric fan may preferably further include a fixing portion that fixes the other end of the vibrating plate to the upper portion of a heat sink such that each of the plurality of blades are located in each of the grooves between heat dissipating fins of the heat sink. The vibrating plate may preferably be fixed to the heat sink by the fixing portion such that the removed regions are located over the grooves between the heat dissipating fins of the heat sink, for example. The vibrating plate may preferably be configured such that the plurality of blades are bent toward the grooves between the heat dissipating fins, for example.

With this configuration, the vibrating plate is bent at a central portion thereof. Therefore, when the piezoelectric fan is provided on the heat sink, the height of the cooling device is reduced.

In addition, because the vibrating plate is fixed such that the removed regions are located over the grooves between the heat dissipating fins of the heat sink, a downward flow of cool air through the openings or cutouts into the grooves between the heat dissipating fins, or an upward flow of air warmed by the heat dissipating fins through the openings or cutouts is generated. Therefore, the ventilation of the grooves between the heat dissipating fins is further improved.

Thus, the overall size of the entire cooling device is prevented from being increased while the cooling capability is further improved.

The number of the blades of the vibrating plate may preferably be lesser than or equal to the number of the grooves between the heat dissipating fins, for example.

With this configuration, the blades at both ends, which have the greater amplitude, are always located in the grooves between the heat dissipating fins. That is to say, because the blades having the greatest airflow generating capability are always located in the grooves between the heat dissipating fins, the cooling capability is improved.

The at least one piezoelectric element may preferably include two piezoelectric elements attached to the vibrating plate so as to sandwich the vibrating plate, for example.

With this structure, the piezoelectric elements and the vibrating plate define a bimorph vibrator. Due to this structure, the amount of bending displacement caused by the applied voltage increases, and the amplitude of the blades increases. Therefore, the cooling capability is further improved.

According to various preferred embodiments of the present invention, the cooling capability of a piezoelectric fan can be significantly improved by improving the airflow generating capability of the blades and improving the ventilation of the grooves between the heat dissipating fins.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

First Preferred Embodiment

A cooling device according to a first preferred embodiment of the present invention will be described below with reference to the drawings.

Figure 4:
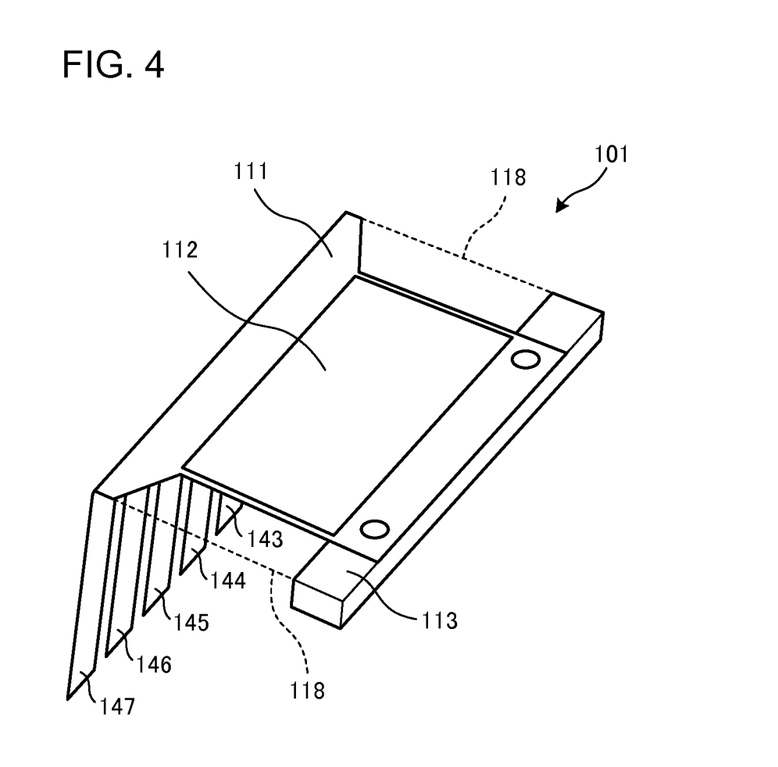
FIG. 4 is a perspective view showing the configuration of a piezoelectric fan used in a cooling device according to a first preferred embodiment of the present invention.
Figure 5:
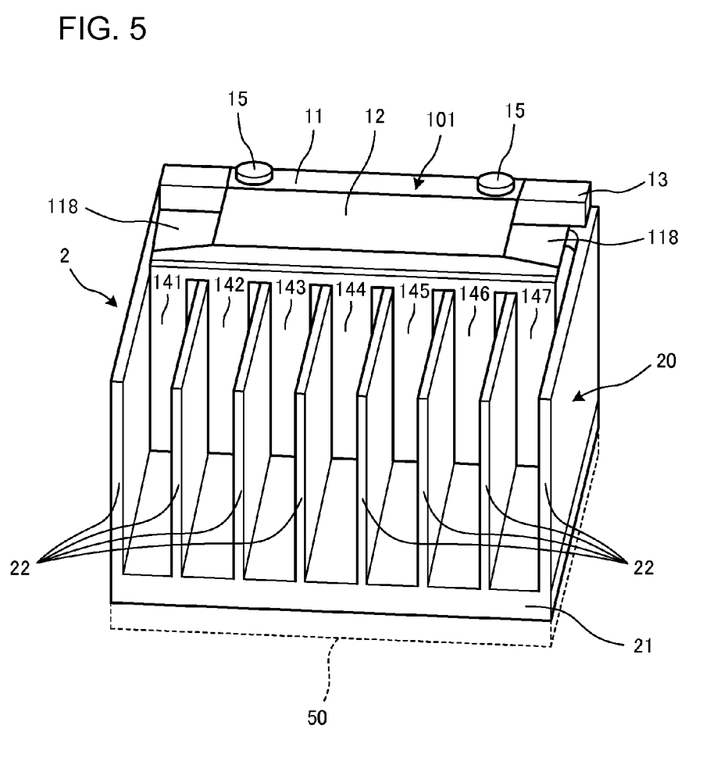
FIG. 5 is a perspective view showing the configuration of the cooling device according to the first preferred embodiment of the present invention.
Figure 6:
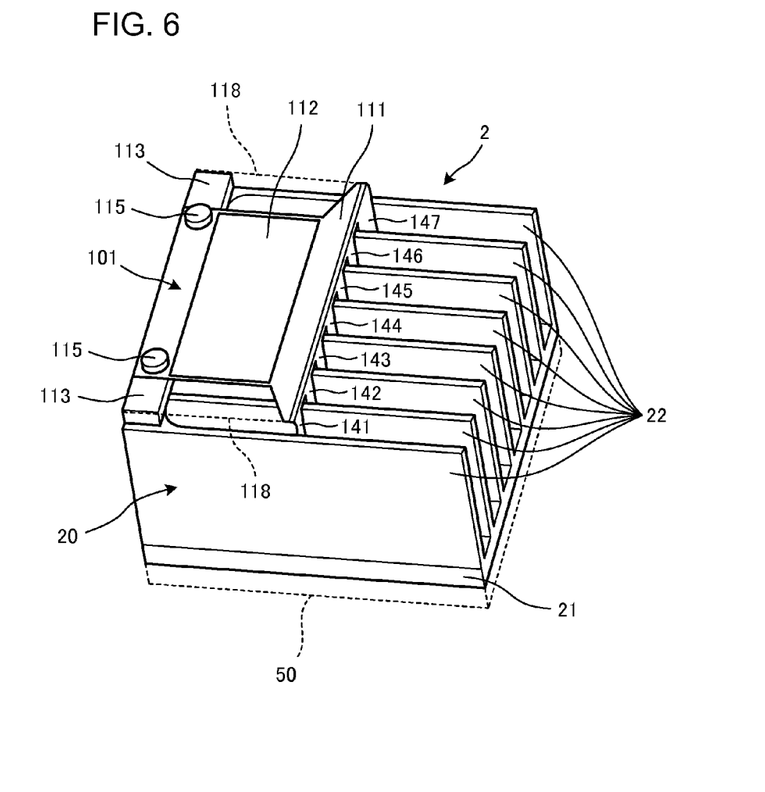
FIG. 6 is a perspective view showing the configuration of the cooling device according to the first preferred embodiment of the present invention.
Figure 7:
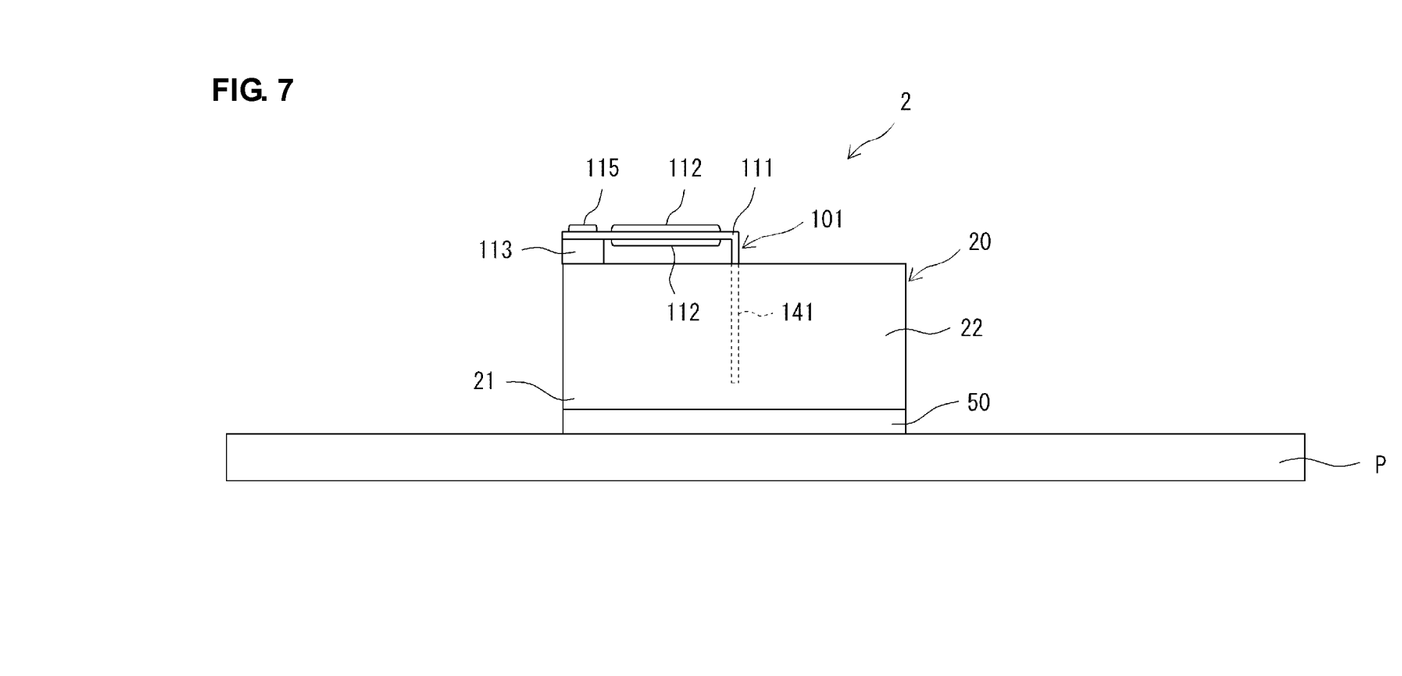
FIG. 7 is a side view showing the configuration of the cooling device according to the first preferred embodiment of the present invention disposed on the upper surface of a heat generating body mounted on a circuit board.

FIG. 4 is a perspective view showing the configuration of a piezoelectric fan used in the cooling device according to the first preferred embodiment of the present invention. FIGS. 5 and 6 are perspective views showing the configuration of the cooling device. FIG. 7 is a side view showing the configuration of the cooling device disposed on the upper surface of a heat generating body mounted on a circuit board.

A piezoelectric fan 101 includes a vibrating plate 111, piezoelectric elements 112, and a supporting plate 113. A heat sink 20 includes a plurality of heat dissipating fins 22 extending from a base portion 21 upward and parallel or substantially parallel to each other. In FIGS. 5 to 7, a heat generating body 50, such as a CPU, for example, is mounted on a circuit board P, and the bottom surface of the heat sink 20 is disposed on the upper surface of the heat generating body 50 so as to be thermally coupled thereto. A cooling device 2 includes the piezoelectric fan 101 and the heat sink 20 preferably made of aluminum, for example.

The piezoelectric elements 112 are attached to both surfaces of the vibrating plate 111. By expanding and contracting the piezoelectric elements 112, the vibrating plate 111 is bent. The vibrating plate 111 preferably includes seven blades 141 to 147, for example, provided at one end thereof. By bending the vibrating plate 111, the seven blades 141 to 147 swing. The seven blades 141 to 147 are preferably bent about 90 degrees, for example, toward the grooves between heat dissipating fins 22.

The vibrating plate 111 is preferably made by die-cutting cutouts 118 in a stainless steel plate having dimensions of about 45 mm wide, about 50 mm long, and about 0.1 mm thick, for example. Therefore, the vibrating plate 111 includes removed portions at both sides of a portion to which the piezoelectric elements 112 are attached, and more specifically, at both sides in a direction perpendicular or substantially perpendicular to the longitudinal direction of the blades.

The dimension of the vibrating plate 111 is preferably as follows:
Total width (i.e., width of the portion of the seven blades 141 to 147): about 45 mm
Width of each blade: about 2.0 mm
Width of the portion to which the piezoelectric elements 112 are attached: about 35 mm
Total length: about 50 mm
Length from the other end of the vibrating plate 111 to the edge portion (i.e., bent portion) of the vibrating plate 111: about 25 mm
Length from the tips of the seven blades 141 to 147 to the edge portion (i.e., bent portion) of the vibrating plate 111: about 25 mm
Thickness: about 0.1 mm The piezoelectric elements 112 are each preferably about 30 mm wide, about 15 mm long, and about 50 µm thick, for example. The two piezoelectric elements 112 sandwich the vibrating plate 111 which functions as an intermediate electrode and define a bimorph vibrator. Each of the two piezoelectric elements 112 preferably includes an electrode film disposed on the surface of the piezoelectric ceramics thereof. Polarization treatment is performed such that the vibrating plate 111 is bent in the longitudinal direction by applying a driving voltage according to the direction of polarization of the piezoelectric elements 112 between each electrode and the vibrating plate 111 functioning as an intermediate electrode. By forming a bimorph vibrator, the amount of bending displacement of the vibrating plate 111 caused by the applied voltage is increased, and the amplitude of the blades 141 to 147 is more effectively increased.

The other end of the vibrating plate 111 is fixed with screws 115 to the upper portion of the heat sink 20 with the supporting plate 113 disposed therebetween such that the seven blades 141 to 147 are located in the grooves between the heat dissipating fins 22 of the heat sink 20 and the cutouts 118 are located over the grooves between the heat dissipating fins 22. Thus, when the piezoelectric fan 101 is driven, each of the seven blades 141 to 147 of the piezoelectric fan 101 swings between adjacent heat dissipating fins 22 without coming into contact with the heat dissipating fins 22. The supporting plate 113 is preferably made of glass epoxy, for example, and preferably has dimensions of about 50 mm wide, about 5 mm long and about 2 mm thick, for example.

With the configuration described above, heat generated in the heat generating body 50 is conducted to the heat sink 20, air is warmed by the heat dissipating fins 22, and warm air is generated between the heat dissipating fins 22. The piezoelectric fan 101 discharges the warm air between the heat dissipating fins 22 by swinging the blades 141 to 147.

A comparison was made between the airflow generating capability of the piezoelectric fan 10 of KANEKO and the airflow generating capability of the piezoelectric fan 101 of this preferred embodiment.

In addition, the piezoelectric fan 10 and the piezoelectric fan 101 were compared such that each of the plurality of blades 141 to 147 is located in each groove between heat dissipating fins 22 of the heat sink 20. A PCB plate (not illustrated) is fixed between the supporting plate 113 and the upper portion of the heat sink 20 and below the cutouts 118 of the piezoelectric fan 101 to compare the airflow generating capability.

Figure 8:
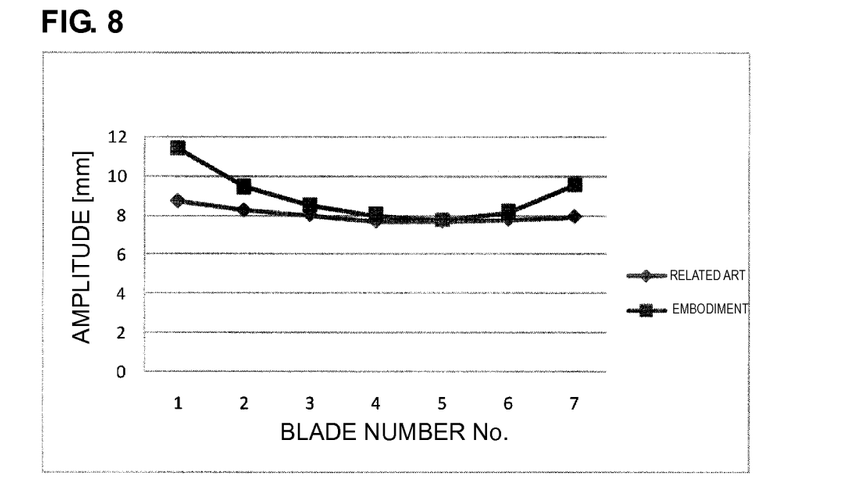
FIG. 8 is a graph showing the relationship between each blade of the piezoelectric fan and its amplitude.

FIG. 8 is a graph showing the relationship between each blade of the piezoelectric fan and its amplitude. This graph shows the results of experiments on the piezoelectric fan 10 and the piezoelectric fan 101 in which a sine wave AC voltage of about 24 Vpp, about 90 Hz was applied between the electrode of each piezoelectric element and the vibrating plate, and the amplitude of the tip of each blade was measured. The blade numbers 1 to 7 correspond to the blades 141 to 147, respectively.

As shown in FIG. 8, in the piezoelectric fan 10 of KANEKO, the average amplitude of the tips of all of the blades was about 7.8 mm, whereas in the piezoelectric fan 101 according to the first preferred embodiment, the average amplitude of the tips of all the blades was about 8.7 mm. In addition, the thermal resistance of the heat sink 20 also improved from about 3.2 K/W to about 2.8 K/W.

Further, in the piezoelectric fan 10 of KANEKO, the amplitudes of the tips of the blades at both ends were about 8.7 mm and about 8.0 mm, whereas in the piezoelectric fan 101 according to the first preferred embodiment, the amplitudes of the tips of the blades 141 and 147 at both ends increased significantly to about 11.5 mm and about 9.7 mm. As shown in FIGS. 5 and 6, there are no blades on the outer side of the heat dissipating fins 22 at both ends of the heat sink 20, and therefore the heat dissipating fins 22 at both ends are relatively difficult to cool. However, it was clear that with the piezoelectric fan 101 according to the first preferred embodiment, the amplitude of the tips of the blades 141 and 147 at both ends increased significantly, and therefore, the thermal resistance of the heat sink 20 also improved from about 2.8 K/W to about 2.6 K/W.

That is to say, it was clear from the experiments that with the piezoelectric fan 101 according to the first preferred embodiment, the airflow generating capability of the blades 141 to 147 improved significantly.

The above experimental results are attributed to the fact that by providing the cutouts 118 in the vibrating plate 111, the volume and mass of portions of the vibrating plate 111 on both sides of the piezoelectric elements 112 are decreased, and the amount of bending displacement of the vibrating plate 111 caused by the applied voltage is increased accordingly.

Next, the ventilation characteristics of the piezoelectric fan 101 will be described. When the piezoelectric fan 101 is driven and the blades 141 to 147 swing, a downward flow of cool air through the cutouts 118 into the grooves between the heat dissipating fins 22 or an upward flow of air warmed between the heat dissipating fins 22 through the cutouts 118, is generated. With the piezoelectric fan 101 according to the first preferred embodiment, the ventilation of the grooves between the heat dissipating fins 22 is improved and the thermal resistance of the heat sink 20 is improved from about 2.6 K/W to about 2.3 K/W. Therefore, the heat dissipating effect of the heat dissipating fins 22 is increased.

As described above, with the piezoelectric fan 101 according to the first preferred embodiment, the cooling capability is improved by improving the airflow generating capability of the blades 141 to 147 and improving the ventilation of the grooves between the heat dissipating fins 22.

In addition, the amplitude of the tips of the blades 141 and 147 at both ends increases significantly, and therefore, the heat dissipating fins 22 at both ends, which are relatively difficult to cool as described above, are effectively cooled.

In addition, although the vibrating plate 111 has a relatively large total length, the height of the cooling device 2 can be reduced by bending the vibrating plate 111, and therefore, the cooling capability can be improved while not increasing the size of the entire cooling device 2.

When a blower fan (not shown) is disposed above the heat sink 20, cool air blown by the blower fan flows through the cutouts 118 into the grooves between the heat dissipating fins 22. Therefore, by using the piezoelectric fan 101 according to the first preferred embodiment in combination with a blower fan, the ventilation of the grooves between the heat dissipating fins 22 can be further improved, and the cooling capability can be further improved.

Second Preferred Embodiment

Figure 9:
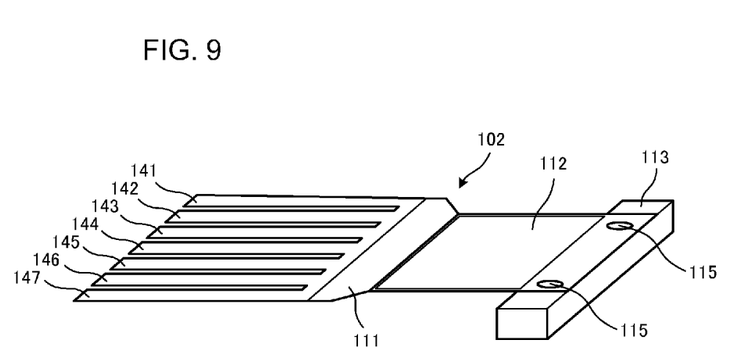
FIG. 9 is a perspective view of a piezoelectric fan used in a cooling device according to a second preferred embodiment of the present invention.
Figure 10:
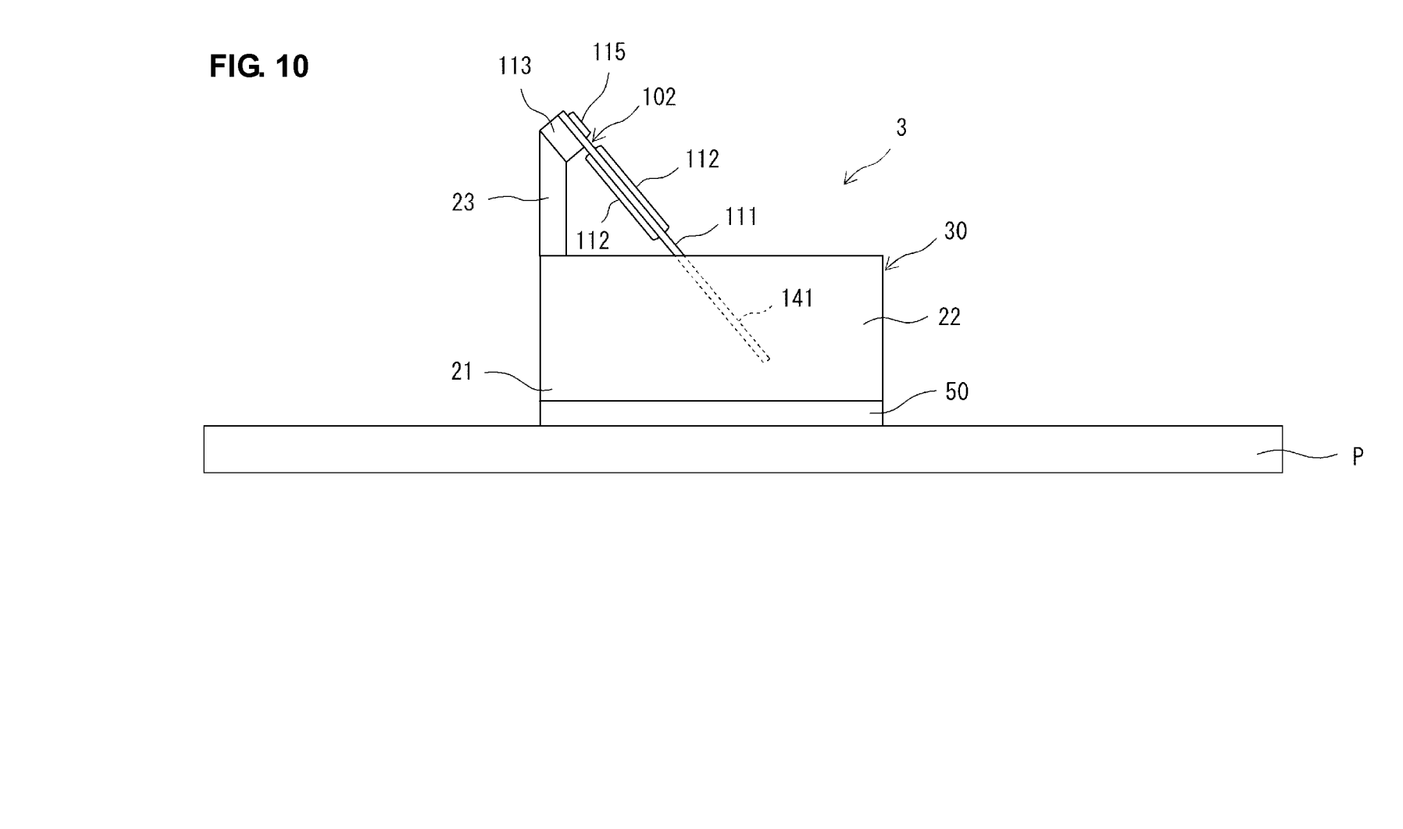
FIG. 10 is a side view showing the configuration of the cooling device according to the preferred second embodiment of the present invention disposed on the upper surface of a heat generating body mounted on a circuit board.

FIG. 9 is a perspective view of a piezoelectric fan used in a cooling device according to a second preferred embodiment of the present invention. FIG. 10 is a side view showing the configuration of the cooling device disposed on the upper surface of a heat generating body mounted on a circuit board. In FIGS. 5 and 6, the vibrating plate 111 is bent toward the grooves between the heat dissipating fins 22. However, as shown in FIGS. 9 and 10, the vibrating plate 111 may preferably be fixed to a heat sink 30 having a mounting plate 23 provided on the top of the back end thereof, without being bent. In this cooling device 3, the other end of the vibrating plate 111 of the piezoelectric fan 102 is fixed with screws 115 to the mounting plate 23 of the heat sink 20 with the supporting plate 113 disposed therebetween such that the plurality of blades 141 to 147 are located in the grooves between the heat dissipating fins 22 of the heat sink 20 and the cutouts 118 are located over the grooves between the heat dissipating fins 22.

Third Preferred Embodiment

Figure 11:
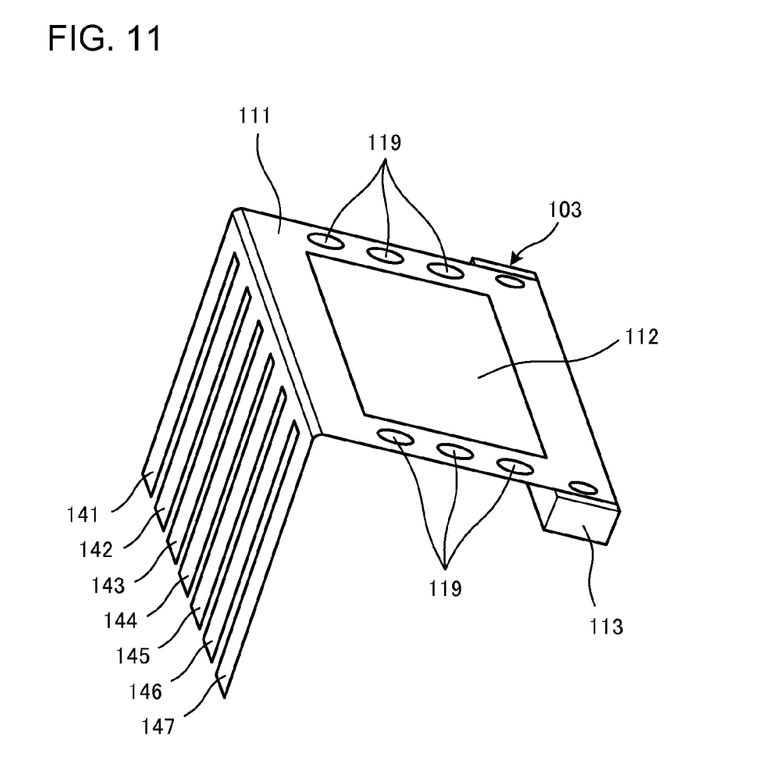
FIG. 11 is a perspective view of a piezoelectric fan used in a cooling device according to a third preferred embodiment of the present invention.

FIG. 11 is a perspective view of a piezoelectric fan used in a cooling device according to a third preferred embodiment of the present invention. In FIGS. 5 and 6, a piezoelectric fan 101 including a vibrating plate 111 having cutouts 118 provided therein is fixed to a heat sink 20. However, as shown in FIG. 11, a piezoelectric fan 103 including a vibrating plate 111 having openings 119 provided therein may preferably be fixed to a heat sink 20. In this piezoelectric fan 103, a downward flow of cool air through the openings 119 into the grooves between the heat dissipating fins 22, or an upward flow of air warmed between the heat dissipating fins 22 through the openings 119 is generated.

It was confirmed that the piezoelectric fan 103 has substantially the same airflow generating capability as the piezoelectric fan 101.

Fourth Preferred Embodiment

Figure 12:
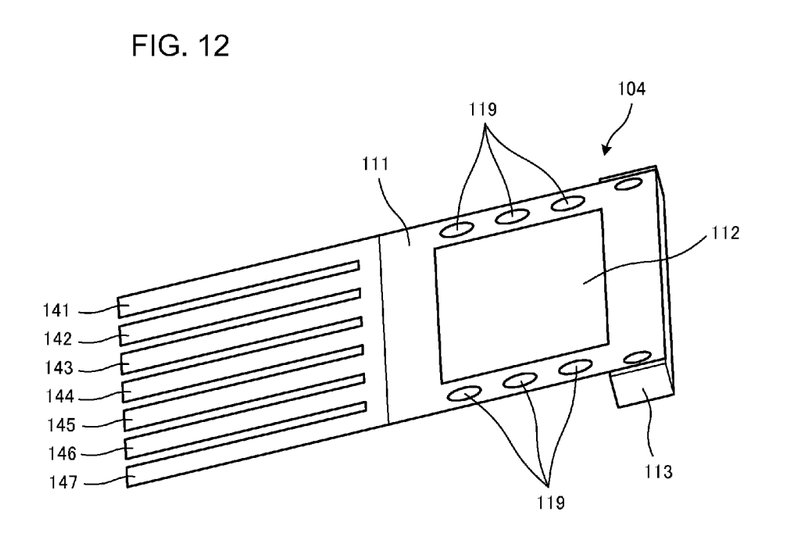
FIG. 12 is a perspective view of a piezoelectric fan used in a cooling device according to a fourth preferred embodiment of the present invention.

FIG. 12 is a piezoelectric fan used in a cooling device according to a fourth preferred embodiment of the present invention. In FIG. 11, the vibrating plate 111 is bent toward the grooves between the heat dissipating fins 22. However, as shown in FIG. 12, a vibrating plate 111 having openings 119 provided therein may be fixed to the heat sink 30 without being bent.

In the above-described preferred embodiments of the present invention, two piezoelectric elements 112 are preferably attached to a vibrating plate 111 so as to sandwich the vibrating plate 111 such that the piezoelectric elements 112 and the vibrating plate 111 define a bimorph vibrator. However, a piezoelectric element 112 may be attached to one surface of a vibrating plate 111 so that the piezoelectric element 112 and the vibrating plate 111 define a unimorph vibrator.

In the above-described preferred embodiments of the present invention, the blades 141 to 147 may preferably be made not only of stainless steel but also of a highly spring metal plate, such as a phosphor bronze plate or a resin plate, for example.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A piezoelectric fan comprising:
at least one piezoelectric element arranged to expand and contract in response to an application of a voltage;
a vibrating plate to which the at least one piezoelectric element is attached, the vibrating plate being bent by expanding and contracting of the at least one piezoelectric element, the vibrating plate including a plurality of blades provided at a first end thereof, the plurality of blades being arranged to swing as a result of then bending of the vibrating plate; and
a fixing portion arranged to fix a second end of the vibrating plate opposite to the first end of the vibrating plate to an upper portion of a heat sink such that the plurality of blades are located in grooves between a plurality of heat dissipating fins of the heat sink; wherein
the vibrating plate includes removed regions arranged on both sides of a portion to which the at least one piezoelectric element is attached;
the vibrating plate is fixed to the heat sink by the fixing portion such that the removed regions are located over the grooves between the heat dissipating fins of the heat sink; and
the vibrating plate is arranged such that the plurality of blades are bent toward the grooves between the heat dissipating fins.

2. The piezoelectric fan according to claim 1, wherein a number of the blades of the vibrating plate is less than or equal to a number of the grooves between the heat dissipating fins.

3. The piezoelectric fan according to claim 1, wherein the at least one piezoelectric element includes two piezoelectric elements attached to the vibrating plate so as to sandwich the vibrating plate.

4. The piezoelectric fan according to claim 1, wherein the removed regions of the vibrating plate are defined by cutouts in the vibrating plate arranged on both sides of the portion to which the at least one piezoelectric element is attached.

5. The piezoelectric fan according to claim 1, wherein the removed regions of the vibrating plate are defined by openings in the vibrating plate arranged on both sides of the portion to which the at least one piezoelectric element is attached.

6. A cooling device comprising:
piezoelectric fan according to claim 1; and
a heat sink including a plurality of heat dissipating fins.

* * * * *